United States Patent [19]
Matsuura et al.

[11] Patent Number: 5,510,425
[45] Date of Patent: Apr. 23, 1996

[54] POLYIMIDES, THERMOSETTING RESIN COMPOSITIONS CONTAINING THE POLYIMIDES, FORMED ARTICLES OF THE RESIN COMPOSITIONS, AND PRODUCTION PROCESS OF THE POLYIMIDES

[75] Inventors: Hidekazu Matsuura, Oyama; Yoshihide Iwasaki, Tsukuba; Kaori Ikeda, Beppu; Takayuki Suzuki; Masashi Tanaka, both of Shimodate; Yasuo Miyadera, Tsukuba, all of Japan

[73] Assignee: Hitachi Chemical Company, Ltd., Japan

[21] Appl. No.: 270,182

[22] Filed: Jul. 1, 1994

Related U.S. Application Data

[62] Division of Ser. No. 853, Jan. 5, 1993, abandoned.

[30] Foreign Application Priority Data

Jan. 7, 1992 [JP] Japan ............................. 4-810
Jan. 10, 1992 [JP] Japan ............................. 4-3124
Jun. 15, 1992 [JP] Japan ............................. 4-153943

[51] Int. Cl.$^6$ ..................... C08F 283/04; C08L 63/00
[52] U.S. Cl. ..................... 525/423; 525/422; 525/424; 525/438; 525/510; 525/528; 525/530; 525/533; 525/928; 428/355; 428/413; 428/473.5
[58] Field of Search ..................... 525/423, 422, 525/424, 438, 510, 528, 530, 533, 928; 428/355, 413, 473.5

[56] References Cited

U.S. PATENT DOCUMENTS

| | | | |
|---|---|---|---|
| 4,294,877 | 10/1981 | Graham | 525/530 |
| 4,519,941 | 5/1985 | Anderson | 523/457 |
| 4,629,777 | 12/1986 | Pfeifer | 528/353 |
| 4,645,806 | 2/1987 | Freitag et al. | 525/390 |
| 4,719,283 | 1/1988 | Bartmann | 528/170 |
| 4,762,906 | 8/1988 | Hisgen et al. | 528/170 |
| 4,820,779 | 4/1989 | Schoenberg | 525/423 |
| 5,021,519 | 6/1991 | Varde et al. | 525/423 |
| 5,043,419 | 8/1991 | Ohta et al. | 528/125 |
| 5,070,181 | 12/1991 | Kawai et al. | 528/353 |
| 5,112,942 | 5/1992 | Blocker | 528/125 |
| 5,145,937 | 9/1992 | Hergenrother et al. | 528/125 |
| 5,153,303 | 10/1992 | Jasne et al. | 528/125 |
| 5,171,822 | 12/1992 | Pater | 528/125 |
| 5,171,828 | 12/1992 | Meterro et al. | 528/125 |
| 5,171,829 | 12/1992 | Uekita et al. | 528/125 |
| 5,175,240 | 12/1992 | Kreuz et al. | 528/125 |
| 5,189,116 | 2/1993 | Boyd et al. | 525/423 |
| 5,196,500 | 3/1993 | Kreuz et al. | 528/125 |
| 5,212,278 | 5/1993 | Pfaendner et al. | 525/390 |
| 5,229,485 | 7/1993 | Kramer et al. | 528/352 |
| 5,231,160 | 7/1993 | Tamai et al. | 528/352 |
| 5,237,044 | 8/1993 | Jarunatari et al. | 528/125 |

FOREIGN PATENT DOCUMENTS

| | | |
|---|---|---|
| 0341052 | 11/1989 | European Pat. Off. . |
| 0357006 | 3/1990 | European Pat. Off. . |
| 2592050 | 6/1986 | France . |
| 2041231 | 6/1971 | Germany . |

*Primary Examiner*—Thomas Hamilton, III
*Assistant Examiner*—Randy Gulakowski
*Attorney, Agent, or Firm*—Pennie & Edmonds

[57] ABSTRACT

A polyimide comprises structural units represented by the following formula:

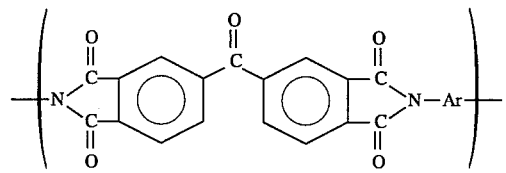

wherein Ar is a group consisting of 10–90 mole % of a first specific structural sub-unit and 90–10 mole % of a second particular structural sub-unit. A process for the production of the polyimide and a thermosetting resin composition comprising the polyimide and a particular polymaleimide are also disclosed.

2 Claims, 2 Drawing Sheets

FIG. 1

POLYIMIDES, THERMOSETTING RESIN COMPOSITIONS CONTAINING THE POLYIMIDES, FORMED ARTICLES OF THE RESIN COMPOSITIONS, AND PRODUCTION PROCESS OF THE POLYIMIDES

This is a division of application Ser. No. 08/000,853, filed Jan. 5, 1993 now abandoned.

BACKGROUND OF THE INVENTION

1) Field of the Invention

This invention relates to novel polyimides having excellent solubility in organic solvents and a low softening point, thermosetting resin compositions containing the polyimides and permitting low-temperature molding, extrusion or forming, molded, extruded or otherwise formed articles of the thermosetting resin compositions, such as sheet-like adhesives, as well as a production process of the novel polyimides.

2) Description of the Related Art

Polyimides have excellent heat resistance but many of them have inferior formability, for example, moldability due to their insolubility and infusibility. To form a polyimide into a film or the like, it has been the conventional practice to form a film with a varnish of its precursor, i.e., a polyamic acid in an organic solvent and then to imidate the polyamic acid. It is however necessary to store the varnish at a low temperature because the molecular weight of the polyamic acid is lowered by hydrolysis. This conventional practice is accompanied by further problems. The solvent employed is highly hygroscopic so that a resin tends to precipitate due to absorption of moisture. Upon imidation subsequent to the formation of the varnish into a film or the like, water is formed through condensation, leaving voids in the article so formed. The conventional process cannot be applied to base materials having low heat resistance, because it requires a temperature as high as at least 300° C. upon imidation.

With a view toward overcoming these problems, polyimides soluble in organic solvents have been developed. For example, polyimides obtained from 4,4'-methylenebis(2,6-dialkylanilines) and acid dianhydrides such as biphenyltetracarboxylic dianhydride and pyromellitic dianhydride, as disclosed in U.S. Pat. Nos. 4,851,505 and 4,935,490, are soluble in N-methylpyrrolidone and m-cresol. These polyimides, however, all have a glass transition point higher than 400° C. so that high temperatures are indispensable for their molding, extrusion or forming.

Resin compositions, each of which comprises a polyamic acid or polyimide and a polymaleimide, have found a wide variety of utility because they exhibit high strength, toughness and heat resistance when cured. For example, they are used as adhesives or varnishes for the fabrication of printed circuit boards or prepregs. These prepregs are in turn employed for the fabrication of printed circuit boards.

For example, U.S. Pat. No. 4,362,826 discloses a thermosetting resin composition which comprises a bismaleimide compound and a polyamic acid obtained from 4,4'-diaminodiphenyl ether and pyromellitic dianhydride. By way of example, it is disclosed that this composition can be formed into a cured film (a film carried on a base material) by casting it on a base material such as a copper foil and then heating and drying the same.

A resin composition formed by adding a bismaleimide compound to a polyamic acid as described above, however, requires not only to react a polymaleimide but also to imidate the polyamic acid upon curing because of the use of the polyamic acid. It is hence necessary to heat the resin composition to a temperature of 300° C. or higher upon curing. This makes it impossible to apply the resin composition to a base material which has low resistance to heat. Further, water is formed through condensation as the imidation of the polyamic acid proceeds. Occurrence of voids cannot therefore be ignored although this problem is somewhat reduced for the existence of the polymaleimide. Occurrence of such voids causes a significant reduction in bonding force especially when the composition is cured while being interposed between a Kapton® film (polyimide film) and a metal foil such as a copper foil in order to bond them together. It is also well-known to those skilled in the art that a polyimide obtained by imidating a polyamic acid as disclosed in U.S. Pat. No. 4,362,826 is insoluble in organic solvents and is infusible. In addition, U.S. Pat. No. 4,362,826 discloses no specific examples of polyimides soluble in organic solvents.

Examples of compositions each of which comprises a polyimide and a polymaleimide include those disclosed, for example, in U.S. Pat. No. 3,842,143. Each composition disclosed in this patent is formed by adding a polymaleimide to a polyimide of a low molecular weight which has been obtained by reacting a tetracarboxylic dianhydride with an excess amount of a diamine and contains an amino group at each end. When such a low m.w. polyimide is employed, however, a film obtained from the resulting composition does not have flexibility and cannot be used as a self-supporting film. U.S. Pat. No. 3,842,143 contains neither examples of compositions having flexibility sufficient to provide self-supporting films nor examples of polyimides therefor.

Further, Japanese Patent Application Laid-Open (Kokai) No. SHO 62-30112 discloses that a composition of a polyimide—which has been obtained using 3,3',4,4'-benzophenonetetracarboxylic dianhydride, bis[4-(3-aminophenoxy)phenyl]sulfone and, optionally, 2,4-diaminotoluene—and a polymaleimide has good film formability and a film so formed shows excellent bonding property. It is also disclosed that the polyimide is soluble in a mixed solvent of toluene and m-cresol and also in N,N-dimethylformamide (DMF). However, the polyimide disclosed in Japanese Patent Application Laid-Open (Kokai) No. SHO 62-30112 is not soluble in a mixed solvent of toluene and DMF. Further, the above composition is fusible, can be molded, extruded or otherwise formed at relatively low temperatures ranging from 250° C. to 275° C., and exhibits superb bonding property. At forming temperatures of 230° C. and lower, its characteristic properties are reduced.

As is evident from the foregoing, there has been known to date neither a composition which contains a polyimide and a polymaleimide, shows excellent properties at substantially low molding, extruding or forming temperatures and has excellent film formability nor a polyimide for such a composition.

As insulating adhesives for electronic materials, adhesives such as acrylic, phenolic, epoxy and polyimide adhesives are known. Further, hot-melt adhesives are also employed for such applications.

Acrylic, phenolic and epoxy adhesives are excellent in bonding property but are inferior in heat resistance. Hot-melt adhesives require a high bonding temperature around 300° C. so that limitations are imposed on bondable materials and heating apparatuses. Because of their hot-melt property, the adhesives become soft when exposed to high temperatures even after bonding, so that the hot-melt adhesives cannot retain sufficient strength. In addition, conventional polyimide adhesives require a temperature and pressure as high as 275° C. and 5 MPa for bonding.

SUMMARY OF THE INVENTION

A first object of the present invention is to provide a novel polyimide having excellent solubility in organic solvents and a low softening point.

A second object of the present invention is to provide a thermosetting resin composition which can be molded, extruded or otherwise formed at low temperatures, for example, can be cured at low temperatures to exhibit bonding property.

In one aspect of the present invention, there is thus provided a novel polyimide comprising structural units represented by the following formula (I):

wherein Ar is a group consisting of:
i) 10–90 mole % of a structural sub-unit represented by the following formula (a):

wherein $Z^4$ represents —$SO_2$— or —$C(CH_3)_2$—
ii) 90–10 mole % of another structural sub-unit represented by the following formula (b):

wherein $R^1$, $R^2$, $R^3$ and $R^4$ independently represent a hydrogen atom or a $C_{1-4}$ alkyl or alkoxyl group, at least two of which are independently an alkyl or alkoxyl group; and X is —$CH_2$—, —$C(CH_3)_2$—, —O—, —$SO_2$—, —C(=O)— or —CO—NH—.

In another aspect of the present invention, there is also provided a thermosetting resin composition comprising (A) the novel polyimide described above and (B) a polymaleimide represented by the following formula (II):

wherein l stands for an integer of 2 or greater and R is a group having 2 or more carbon atoms and a valence of l. The thermosetting resin comprises may further comprises (C) an epoxy resin as needed.

The novel polyimide according to the present invention has a low softening point and is soluble in organic solvents having lower polarity.

The thermosetting resin composition according to the present invention permits molding, extrusion or forming at low temperatures and has excellent bonding property. A product obtained by curing the thermosetting resin composition is excellent in heat resistance and solvent resistance.

Further, the thermosetting resin composition containing the epoxy resin can achieve bonding at a temperature as low as about 180° C. when employed as an adhesive. Different from conventional heat-resistant adhesives, it does not require any high temperature upon bonding. Two-roll bonding is hence feasible, so that the epoxy-resin-containing thermosetting resin composition permits easy handling. Moreover, it has excellent bonding force even at high temperatures. It can be formed into a sheet in advance. Since it is soluble in a solvent, it can be coated on a base material beforehand to achieve bonding of the base material with another material.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE INVENTION AND PREFERRED EMBODIMENTS

The novel polyimide according to the present invention will next be described in detail.

In the formula (a), examples of the substituent or substituents which may be bonded on a benzene ring include lower alkyl groups such as methyl, ethyl and isopropyl, halogen atoms such as chlorine, bromine and fluorine, alkoxyl groups such as methoxyl and ethoxyl, and fluorine-substituted alkyl groups such as trifluoromethyl, pentafluoroethyl, perfluorobutyl, perfluorohexyl and perfluorooctyl. When plural substituents are contained, they may be the same or different.

A group represented by the following formula (a):

wherein $Z^1$, $Z^2$ and $Z^3$ independently represent —$SO_2$—, or —$C(CH_3)_2$—is particularly preferred from the standpoint of imparting highly-enhanced solvent resistance to a cured product which is to be obtained from the composition of the polyimide (A) and the below-described maleimide (B).

The polyimide described above can be produced by reacting 3,3',4,4'-benzophenonetetracarboxylic dianhydride; a compound represented by the following formula (III'):

wherein $Z^1$, $Z^2$, and $Z^3$ independently represent —$SO_2$—, —O—, —CO—, or —$C(CH_3)_2$—and Y represents an amino or isocyanate group.

and a compound represented by the following formula (IV):

wherein $R^1$, $R^2$, $R^3$, $R^4$ and X have the same meanings as defined above with respect to the formula (b) and Y represents an amino or isocyanate group.

In the above reaction, one or more dianhydrides other than 3,3',4,4'-benzophenonetetracarboxylic dianhydride may be used jointly therewith to extents not impairing the objects of the present invention. Examples of such other dianhydrides include pyromellitic dianhydride, 3,3',4,4'-biphenyltetracarboxylic dianhydride, 2,2',3,3'-biphenyltetracarboxylic dianhydride, 3,3',4,4'-diphenylsulfonetetracarboxylic dianhydride, 3,3',4,4'-diphenyloxytetracarboxylic dianhydride, 4,4'[2,2,2-trifluoro-1-(trifluoromethyl)ethylidene]bis(1,2-benzenedicarboxylic dianhydride), ethylenebistrimellitate dianhydride, catecholbistrimellitate dianhydride, resorcinolbistrimellitate dianhydride, dihydroxybenzenebistrimellitate dianhydride, bisphenol A bistrimellitate dianhydride, tetrachlorobisphenol A bistrimellitate dianhydride, tetrabromobisphenol A bistrimellitate dianhydride and biphenylbistrimellitate dianhydride. These dianhydrides can be used preferably in a total amount of 50 mole % or smaller, particularly 30 mole % or smaller based on the amount of the whole dianhydrides.

Examples of the compounds represented by the formula (III') in which Y represents an amino group include 1,4-bis(3-aminocumyl)benzene, 1,3-bis(3-aminocumyl)benzene, 1,4-bis(4-aminocumyl)benzene, 1,3-bis(4aminophenoxy) benzene, 1,4-bis(3-aminophenoxy)benzene, 1,3-bis(3-aminophenoxy)benzene, 1,4-bis(4-aminophenoxy) benzene, 1,3-bis(4-aminophenoxy) benzene, bis[4-(3-aminophenoxy)phenyl]sulfone, bis-[4-(4-aminophenoxy)phenyl] sulfone, bis[4-(3-aminophenoxy)phenyl]ketone, bis[4-(4-aminophenoxy)phenyl] ketone, bis[4-(3-aminophenoxy)phenyl] ether, bis[4-(4-aminophenoxy)phenyl]ether, 2,2-bis[4-(3-aminophenoxy)phenyl]propane, 2,2-bis[4-(4-aminophenoxy)phenyl]propane, bis[4-(3-aminophenoxyphenyl)hexafluoropropane, bis[4-(4-aminophenoxyphenyl)hexafluoropropane, bis[4-(3-aminobenzoyl) phenyl]sulfone, bis[4-(4-aminobenzoyl)phenyl]sulfone, bis[4-(3-aminobenzoyl)phenyl]ketone, bis[4-(4-aminobenzoyl)phenyl]ketone, bis[4-(3-aminobenzoyl)phenyl] ether, bis[4-(4-aminobenzoyl)phenyl]ether, 2,2-bis[4-(3-aminobenzoyl)phenyl]propane, 2,2-bis[ 4-(4-aminobenzoyl)phenyl]propane, bis[4-(3-anilinosufonyl)phenyl] ether, bis[4-(4-anilinosufonyl)phenyl]ether, bis[3-(3-aminophenoxy)phenyl]sulfone, bis[3-(3-aminophenoxy)phenyl] ketone, 2,2-bis[4-(3-anilinosufonylphenyl] propane, 2,2-bis[4-(4-anilinosufonyl)phenyl] propane, bis[3-(3-aminophenoxy)phenyl]ether, bis[3-(3-aminobenzoyl)phenyl]sulfone, bis[3-(3-aminobenzoylphenyl] ketone, bis[3-(3-aminobenzoyl)phenyl]ether, bis[3-(3-anilinosufonyl)phenyl]ether, 2,2-bis[ 3-(3-aminophenoxy)phenyl]propane, 4,4'-bis[3-(4-amino-α,α'-dimethylbenzyl)phenoxy] diphenylsulfone, 4,4'-bis[3-(4-amino-α,α'-dimethylbenzyl)phenoxy]benzophenone, 4,4'-bis[4-(4-amino-α,α'-dimethylbenzyl)phenoxy] diphenylsulfone, 4,4'-bis[4-(4-amino-α,α'-dimethylbenzyl)phenoxy] benzophenone, 4-[3-(4-amino-α,α'-dimethylbenzyl)phenoxy]-4'-[4-(4-amino-α,α'-dimethylbenzyl)phenoxy] diphenylsulfone, 4-[3-(4-amino-α,α'-dimethylbenzyl)phenoxy]-4'-[4-amino-α,α'-dimethylbenzyl)phenoxy] benzophenone, 4,4'-bis[3-(3-amino-α,α'-dimethylbenzyl)phenoxy] diphenylsulfone, 4,4'-bis[3-(3-amino-α,α-dimethylbenzyl)phenoxy] benzophenone, 4,4'-bis[ 2-(4-amino-α,α'-dimethylbenzyl)phenoxy]diphenylsulfone, 4,4'-bis[2-(4-amino-α,α'-dimethylbenzyl)phenoxy]benzophenone, 3,3'-bis[3-(4-amino-α,α'-dimethylbenzyl)phenoxy]diphenylsulfone, 3,3'-bis[3-(4-amino-α,α'-dimethylbenzyl) phenoxy]benzophenone.

Examples of the compound represented by the formula (III') in which. Y represents an isocyanate group include those similar to the above-exemplified diamines except for the substitution of isocyanate groups for the amino groups.

Examples of the compound represented by the formula (IV) in which Y represents an amino group include 4,4'-diamino-3,3',5,5'-tetramethyldiphenylmethane, 4,4'-diamino-3,3',5,5'-tetraethyldiphenylmethane, 4,4'-diamino-3, 3',5,5'-tetra-n-propyldiphenylmethane, 4,4'-diamino-3,3',5, 5'-tetraisopropyldiphenylmethane, 4,4'-diamino-3,3',5,5'-tetrabutyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diisopropyldiphenylmethane, 4,4'-diamino-3,5-dimethyl-3', 5'-diethyldiphenylmethane, 4,4'-diamino-3,5-dimethyl-3',5'-diisopropyldiphenylmethane, 4,4'-diamino-3,5-diethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenylmethane, 4,4'-diamino-3,3'-diisopropyl-5,5'-dibutyldiphenylmethane, 4,4'-diamino-3,3'-dimethyl-5,5'-dibutyldiphenylmethane, 4,4'-diamino-3,3'-diethyl-5,5'-dibutyldiphenylmethane, 4,4'-diamino-3,3'-dimethyldiphenylmethane, 4,4'-diamino-3,3'-diethyldiphenylmethane, 4,4'-diamino-3,3'-di-n-propyldiphenylmethane, 4,4'-diamino-3,3'-diisopropyldiphenylmethane, 4,4'-diamino-3,3'-dibutyldiphenylmethane, 4,4'-diamino-3,3',5-trimethyldiphenylmethane, 4,4'-diamino-3,3',5-triethyldiphenylmethane, 4,4'-diamino-3,3',5-tri-n-propyldiphenylmethane, 4,4'-diamino-3,3'5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-ethyl-3'-isopropyldiphenylmethane, 4,4'-diamino-3-ethyl-3'-butyldiphenylmethane, 4,4'-diamino-3-isopropyl-3'-butyldiphenylmethane, 2,2'-bis(4-amino-3,5-dimethylphenyl)propane, 2,2'-bis(4-amino-3,5-diethylphenyl)propane, 2,2'-bis(4-amino-3,5-di-n-propylphenyl)propane, 2,2'-bis(4-amino-3,5-diisopropylphenyl)propane, 2,2'-bis(4-amino-3,5-dibutylphenyl)propane, 4,4'-diamino-3,3',5,5'-tetramethyldiphenyl ether, 4,4'-diamino-3,3',5,5'-tetraethyldiphenyl ether, 4,4'-diamino-3,3',5,5'-tetra-n-propyldiphenyl ether, 4,4'-diamino-3,3',5,5'-tetraisopropyldiphenyl ether, 4,4'-diamino-3,3',5,5'-tetrabutyldiphenyl ether, 4,4-diamino-3,3',5,5'-tetramethyldiphenylsulfone, 4,4'-diamino-3,3',5,5'-tetraethyldiphenylsulfone, 4,4'-diamino-3,3',5,5'-tetra-n-propyldiphenylsulfone, 4,4'-diamino-3,3',5,5'-tetraisopropyldiphenylsulfone, 4,4'-diamino-3,3',5,5'- tetrabutyldiphenylsulfone, 4,4'-diamino-3,3',5,5'-tetramethyldiphenyl ketone, 4,4'-diamino-3,3',5,5'-tetraethyldiphenyl ketone, 4,4'-diamino-3,3',5,5'-tetra-n-propyldiphenyl ketone, 4,4'-diamino-3,3',5,5'-tetraisopropyldiphenyl ketone, 4,4'-diamino-3,3',5,5'-tetrabutyldiphenyl ketone, 4,4'-diamino-3,3',5,5'-tetramethylbenzanilide, 4,4'-diamino-3,3',5,5'-tetraethylbenzanilide, 4,4'-diamino-3,3',5,5'-tetra-n-propylbenzanilide, 4,4'-diamino-3,3',5,5'-tetraisopropylbenzanilide and 4,4'-diamino-3,3',5,5'-tetrabutylbenzanilide.

Examples of the compound represented by the formula (IV) in which Y is an isocyanate group include those similar to the above-exemplified diamines except for the substitution of isocyanate groups for the amino groups.

In the present invention, one or more diamines or diisocyanates other than the compounds represented by the formula (III') or the formula (IV) can be used as reaction counterpart or counterparts with the dianhydride to extents not impairing the objects of the invention. It is preferable to use such diamines or diisocyanates in a total amount of 30 mole % or smaller based on the amount of the entire reaction counterparts with the dianhydride. Examples of such diamines include diaminodiphenylmethane, diaminodiphenyl ether, diaminodiphenyl ketone, diaminodiphenylpropane, phenylenediamine, toluenediamine, diaminodiphenyl sulfide, and diaminodiphenylhexafluoropropane. Examples of such a diisocyanate include those similar to the above-exemplified diamines except for the substitution of isocyanate groups for the amino groups.

It is also possible to jointly use a siloxanediamine represented by the following formula (V):

wherein $R^1$ and $R^4$ each represents a divalent organic group, $R^2$ and $R^3$ each represents a monovalent organic group and p stands for an integer of 1–100.

$R^1$ and $R^4$ may independently be a trimethylene, tetramethylene, phenylene or toluylene group, while $R^2$ and $R^3$ may independently be a methyl, ethyl or phenyl group. Plural $R^2$s and $R^3$s can be either the same or different. Where $R^1$ and $R^4$ are each a trimethylene groups and $R^2$ and $R^3$ are each a methyl group in the formula (V), siloxane diamines in which p is 1, about 10, about 20, about 30, about 50 and about 100, respectively, are all commercially available from Shin-Etsu Chemical Co. ,. Ltd. under the trade names of "LP-7100", "X-22-161AS", "X-22-161A", "X-22-161B", "X-22-161C" and "X-22-161E".

Preferably, the compound represented by the formula (III') and the compound represented by the formula (IV) are used at a molar ratio of from 10/90 to 90/10. An unduly small ratio tends to results in lower solubility in solvents, whereas an unduly great ratio tends to lead to a cured product having low solvent resistance. The particularly preferred ratio ranges from 90/10 to 50/50.

In the present invention, each polyimide can be produced as will be described next. When a diamine is used as a reaction counterpart of an acid dianhydride, the acid dianhydride and diamine are heated to 100° C. or higher, preferably 180° C. or higher in an organic solvent, optionally in the presence of a catalyst such as tributylamine, triethylamine or triphenyl phosphite to achieve up to imidation, whereby a polyimide is obtained directly. The catalyst can be used preferably in an amount of 0–15 wt. %, notably 0.01–15 wt. % based on the total amount of the reactants. As an alternative, the acid dianhydride and the diamine are reacted at a temperature below 100° C. in an organic solvent so that a polyamic acid, a precursor of a polyimide, is first prepared in the form of a varnish. The varnish is then heated to effect imidation. Alternatively, the varnish is added with a ring-closing agent, for example, an acid anhydride, such as acetic anhydride, propionic anhydride or benzoic anhydride, a carbodimide compound such as dicyclohexylcarbodiimide, and optionally, a ring-closing catalyst such as pyridine, isoquinoline, trimethylamine, aminopyridine or imidazole to conduct a chemical ring-closing reaction (imidation). Preferably, the ring-closing agent and the ring-closing catalyst can each be employed in an amount of 1–8 moles per mole of the tetracarboxylic acid dianhydride.

Examples of the organic solvent include polar, aprotic solvents such as N-methylpyrrolidone, N,N-dimethylacetamide, N,N-dimethylformamide, dimethylsulfoxide, sulfolane, hexamethylphosphoric triamide and 1,3-dimethyl-2-imidazolidone; and phenolic solvents such as phenol, cresol, xylenol and p-chlorophenol.

Among solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichlene and tetrachloroethane, those capable of dissolving the starting monomer or monomers and the polyimide or polyamic acid therein may be used. Those incapable of dissolving them can also be used provided that they are mixed with another solvent to extents not impairing the solubility of the latter.

Upon production of the polyimide and the polyamic acid, which is a precursor for the polyimide, a solid-phase reaction, a molten-state reaction at 300° C. or lower or the like can be used in some instances.

When a diisocyanate is employed as a reaction counterpart for the dianhydride, the reaction can be carried out in a manner similar to that described above for the direct preparation of a polyimide. Room temperature or higher, particularly 60° C. or higher is however sufficient as the reaction temperature.

In the present invention, it is preferable to use the dianhydride and the reaction counterpart in substantially equimolar amounts. Either of the two reactants, however, may be used in excess of the other by up to 10 mole %, preferably up to 5 mole %.

The thermosetting resin composition will next be described in detail.

A thermosetting resin composition useful as an adhesive, laminate, molding material or the like can be prepared by mixing the polyimide (A) with a polymaleimide (B) represented by the following formula wherein 1 stands for an integer of 2 or greater and R represents a group having at least two carbon atoms and a valence of 1.

Specific examples of the polymaleimide (B) include N,N'-(4,4'-diphenylmethane)bismaleimide, N,N'-(4,4'-diphenyloxy)bismaleimide, N,N'-p-phenylenebismaleimide, N,N'-m-phenylenbismaleimide, N,N'-2,4-tolylenebismaleimide, N,N'-2,6-tolylenebismaleimide, N,N'-ethylenebismaleimide, N,N'-[4,4'-[2,2'-bis[4-(4phenoxy)phenyl]isopropylidene]]bismaleimide, N,N'-[4,4'-[2,2'-bis[4-(4-phenoxy)phenyl)]hexafluoroisopropylidene]]bismaleimide, N,N'-hexamethylenebismaleimide, N,N'-[4,4'-bis(3,5-dimethylphenyl)methane]bismaleimide, N,N'-[4,4'-bis(3,5-diethylphenyl)methane]bismaleimide, N,N'-[4,4'-(3-methyl-5-ethylphenyl)methane]bismaleimide, N,N'-[4,4'-bis(3,5-diisopropylphenyl)methane]bismaleimide, and the compounds represented by the following formulas (VI)–(XI). They can be used either singly or in combination.

application purpose, it is preferred to use the polymaleimide in an amount of 5–180 parts by weight per 100 parts by weight of the polyimide. An unduly small proportion of the polymaleimide leads to insufficient curing, while an excessively great proportion of the polymaleimide results in a brittle resin composition. When it is desired to produce a self-supporting film in particular, it is especially preferred, from the stand-point of imparting sufficient flexibility, to use wherein, r stands for a positive integer.

Although the mixing ratio of the polyimide to the polymaleimide can be suitably determined depending on the the polymaleimide in an amount not greater than 100 parts by weight per 100 parts by weight of the polyimide.

The resin composition according to the present invention can be molded, extruded or otherwise formed at a temperature lower than 275° C., especially at a temperature lower than 230° C. into a product capable of showing excellent heat resistance. To permit molding, extrusion or forming at a still lower temperature, it is preferred to incorporate a radical polymerization initiator, for example, an organic peroxide such as t-butyl perbenzoate, t-butyl hydroperoxide, benzoyl peroxide, 2,5-dimethyl-2,5-di(t-butylperoxy)hexyne-3, dicumyl peroxide, t-butylcumyl peroxide or α,α'-bis(5-butylperoxy-m-isopropyl)benzene. Use of such a radical polymerization initiator permits molding, extrusion or forming at 20° C. or so. The radical polymerization initiator can be used preferably in an amount of 0.1–10 wt. % based on the total amount of the polyimide (A) and the polymaleimide (B).

The resin composition according to the present invention may be a mixture obtained by combining the polyimide (A) and the polymaleimide (B) and, if necessary, the radical polymerization initiator, all in powder forms, or a varnish prepared by dissolving the powdery mixture in an organic solvent. Usable examples of the organic solvent include, in addition to aprotonic polar solvents such as N,N-dimethylformamide and N-methylpyrrolidone, low boiling-point solvents or small polarity organic solvents, for example, ether solvents such as dioxane, tetrahydrofuran, diglyme and monoglyme, chlorinated solvents such as methylene chloride, and aromatic solvents such as toluene.

The resin composition according to the present invention can be added with an epoxy resin (C), for example, a bisphenol epoxy resin such as a bisphenol A epoxy resin or a bisphenol F epoxy resin, a novolak epoxy resin such as a cresol novolak epoxy resin, a phenol novolak epoxy resin or a bisphenol A novolak epoxy resin, a polyhydric alcohol epoxy resin or an alicyclic epoxy resin; a curing agent for the epoxy resin (C), such as dicyandiamide, a polyhydric phenol, an amine or an acid anhydride; and a curing accelerator for the epoxy resin (C), such as a tertiary amine, an imidazole, a masked imidazole or a boron trifluoride complex. Mixed use of the epoxy resin (C) permits molding, extrusion or forming at still lower temperatures.

Regarding the mixing ratio of the polyimide (A) to the thermosetting components, namely, the polymaleimide (B) and the epoxy resin (C), it is preferred to mix the thermosetting components in a total amount of 10–50 wt. %, more preferably 30–40 wt. % based on the total amount of the resin composition. If the total amount of the thermosetting components is smaller than 10 wt. %, the resulting composition cannot be cured sufficiently. A total amount greater than 50 wt. %, on the other hand, results in a resin composition which is too brittle to permit molding, extrusion or forming.

The ratio of the epoxy resin (C) to the polymaleimide (B) in the thermosetting components may vary as desired. To permit curing of the resin composition of this invention at a temperature lower than 180° C., it is desirable to use the epoxy resin (C) in an amount of 20 wt. % or greater, preferably 40–80 wt. %.

A curing agent and/or a curing accelerator may be used as needed in order to induce the curing reaction of the polymaleimide (B) and the epoxy resin (C) at 180° C. or lower.

The following diamines can be mentioned as illustrative curing agents for the polymaleimide.

4,4'-Diaminodiphenyl ether, 4,4'-diaminodiphenylmethane, 4,4'-diaminodiphenylsulfone, 2,2-bis[4-(4-aminophenoxy)phenyl]propane, 2,2-bis[3-methyl-4-(4-aminophenoxy)phenyl]propane, 2,2-bis[4-(4-aminophenoxy)phenyl]butane, 2,2-bis[3-methyl-4-(4-aminophenoxy)phenyl]butane, 2,2-bis[3,5-dimethyl-4-(4-aminophenoxy)phenyl]butane, 2,2-bis[3,5-dibromo-4-(4-aminophenoxy)phenyl]butane, 1,1,1,3,3,3-hexafluoro-2,2bis[3-methyl-4-(4-aminophenoxy)phenyl]propane, bis[4-(4-aminophenoxy)phenyl]sulfone, bis[4-(4-aminophenoxy)phenyl]ether, bis[4-(3-aminophenoxy)phenyl]sulfone, 4,4'-carbonylbis(p-phenylenoxy)dianiline, 4,4'-bis(4-aminophenoxy)biphenyl, metaphenylenediamine, hexamethylenediamine and tetramethylenediamine.

Of these, 2,2-bis[4-(4-aminophenoxy)phenyl]propane is preferred. If necessary, a mixture of two or more of the above diamines can be used.

Examples of the curing accelerator for the polymaleimide include such peroxides as will be listed next.

t-Butyl hydroperoxide, cumene hydroperoxide, diisopropylbenzene hydroperoxide, di-t-butyl peroxide, t-butylcumyl peroxide, dicumyl peroxide, 2,5-dimethyl-2,5-di(t-butylperoxy)hexane, and 2,5-dimethyl-2,5-di(t-butylperoxy)hexane- 3,2,5-dimethyl-2,5-di(benzoylperoxy)hexane.

Of these, dicumyl peroxide is preferred.

No particular limitation is imposed on the curing agent for the epoxy resin insofar as it is generally used as a curing agent for epoxy resins, for instance, dicyandiamide, polyphenols and anhydrides. No particular limitation is imposed either on the curing accelerator. Examples of the curing accelerator include imidazoles such as 2-methylimidazole, 2-methyl-4-ethylimidazole, 2-undecylimidazole and 2-heptadecylimidazole; derivatives thereof; amines such as diethylamine, triethylamine, monoethanolamine and diethanoiamine; and $BF_3$-amine complexes.

Each resin composition according to the present invention can be formed into a cured film by casting it on a glass plate, a stainless steel plate or the like, drying the thus-cast resin composition and then heating the resulting green film. The cured film is useful as an insulating film or as a base film for a laminate.

The resin composition according to the present invention can be used, as is, as an adhesive. Such an adhesive can be used for various applications. It is particularly useful as an adhesive for the production of a metal-clad laminate by bonding a core material, for example, a metal plate such as an aluminum plate, steel plate, stainless steel plate or 42 alloy plate or a plastic film such as a polyimide film or polyaramid film with a metal foil such as a copper foil or aluminum foil. The adhesive can also be used as a bonding tape in tape automated bonding (TAB). This adhesive shows excellent bonding force when heated at a relatively low temperature (i.e., at a forming temperature).

The varnish-form resin composition according to the present invention can be used as a prepreg by impregnating a base material such as a glass fabric or carbon cloth with the resin composition and then drying the thus-impregnated base material.

Upon production of the above film-like adhesive or the prepreg, the drying temperature and time vary depending on the solvent and maleimide (B) employed. It is necessary to control the temperature at a level lower than the temperature at which marked polymerization of the polymaleimide (B) is observed. Since the resin composition according to the present invention can be dissolved in a low boiling-point solvent or in an organic solvent having low polarity and high volatility, it can be dried at lower temperatures. Even if a radical polymerization initiator is present at this time, the resin composition can be easily dried while suppressing its polymerization reaction. It is preferred to control the drying time so that the solvent is allowed to remain in an amount not greater than 5 wt. %.

Each resin composition according to the present invention can also be used in the form of powder as a molding, extruding or forming material. Although the molding, extruding or forming temperature varies depending on the polymaleimide (B), a high heat-resistant product can be obtained by molding, extruding or otherwise forming the resin composition under heat.

It is also possible to provide each resin composition according to the present invention. To coat a base material, the varnish can then be used as is. The base material so coated is then dried. The base material so dried can then be pressed under heat in combination with another base material, whereby the base materials can be bonded together. This pressing can be conducted preferably at 100°–250° C. and 0.1–10 MPa for 20 minutes or longer. It is particularly preferred to conduct such pressing at 150°–200° C. and 1–3 MPa for 60–90 minutes.

It is also possible to produce an adhesive-applied polyimide film by formulating the resin composition according to the present invention into a varnish, coating either one side or both sides of a polyimide film with the varnish and then drying the thus-coated polyimide film. The adhesive-applied polyimide film is useful for the production of a substrate for a flexible printed circuit board or a TAB tape by superposing it with a metal film and then pressing them together under pressure. Further, the polyimide film with adhesive layers on both sides thereof can be used to bond printed circuit boards together or to bond a printed circuit board with a metal foil, for example, a copper foil, aluminum foil or 42 alloy foil for the production of a thin-film multilayer circuit board, a composite metal substrate or the like.

An adhesive-applied, metal-foil-clad polyimide film can also be formed by coating a varnish-form adhesive of this invention to a metal-foil-free side of a polyimide film, said polyimide film having been clad with a metal foil on the other side thereof, and then drying the adhesive. The so-formed polyimide film with the resulting adhesive layer coated on one side thereof and the metal foil clad on the other side thereof is particularly useful for the production of a thin-film multilayer circuit board or a composite lead frame. To provide such a thin-film multilayer circuit board or a composite film frame, it is necessary to bond the so-formed polyimide film with a substrate for a flexible printed circuit board or with a 42 alloy foil under heat and pressure.

The present invention will next be described in detail by the following examples. It should however be borne in mind that this invention is by no means limited to or by the examples.

EXAMPLE 1

In a four-necked flask equipped with a stirrer, thermometer, nitrogen inlet tube and calcium chloride tube, 0.55 g (1.5 mmole) of 4,4'-diamino-3,3',5,5'-tetraisopropyldiphenylmethane (IPDDM), 3.67 g (8.5 mmole) of bis[4-(3-aminophenoxy)phenyl]sulfone (m-APPS) and 29.8 g of N,N-dimethylformamide (DMF) were charged, and then stirred into a solution. While being cooled below 5° C., the resulting solution was added with 3.22 g (10.0 mmole) of 3,3',4,4'-benzophenone tetracarboxylic dianhydride (BTDA) in portions. They were reacted for one hour under cooling below 5° C. and then for 6 hours at room temperature, whereby a polyamic acid was obtained in the form of a varnish. Acetic anhydride (2.55 g) and 1.98 g of pyridine were added to the resultant varnish of the polyamic acid, followed by reaction at room temperature for 3 hours to obtain a polyimide in the form of a varnish. The varnish of the polyimide so obtained was poured into water and the resulting precipitate was collected, pulverized and dried, whereby the polyimide was obtained in the form of powder.

Figure 1:
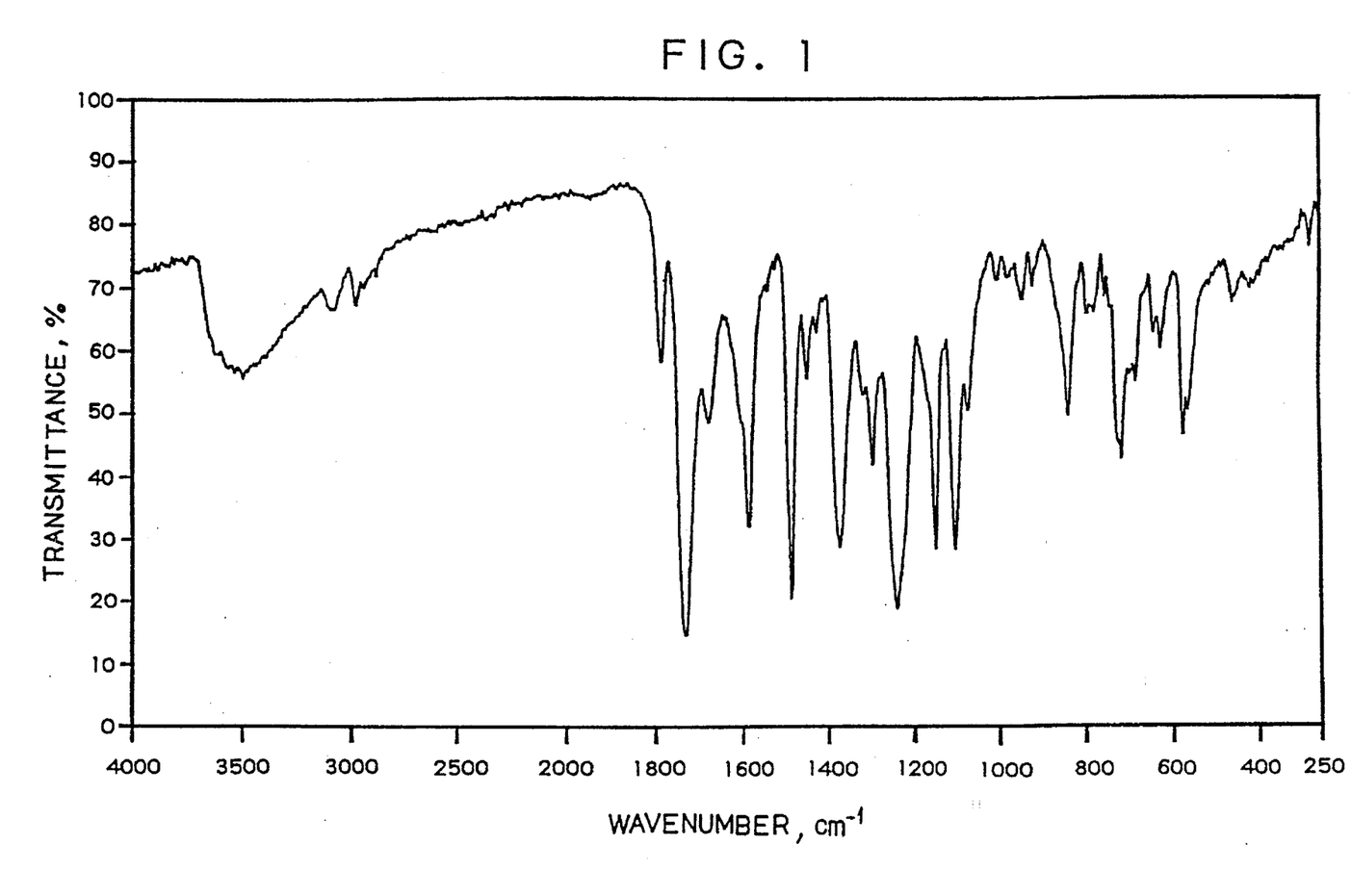
FIG. 1 is an infrared absorption spectrum of the polyimide obtained in Example 1.

The polyimide powder so obtained was dissolved in DMF at a concentration of 0.1 g/dl. The reduced viscosity of the polyimide powder as measured at 30° C. was 1.07 dl/g. FIG. 1 shows an infrared absorption spectrum of the polyimide powder.

In addition, a solubility test of the polyimide powder was conducted by adding it to various organic solvents to give a concentration of 5 wt. % and then observing its state of dissolution at room temperature. As a result, the polyimide powder proved to be soluble in DMF, N-methylpyrrolidone (NMP), N,N-dimethylacetamide (DMAc) and a 1:1 (weight ratio) mixed solvent of DMF and toluene.

Further, the polyimide powder was dissolved in DMF. The varnish so obtained was cast onto a glass plate and dried at 100° C. for 10 minutes. The resulting green film was peeled off from the glass plate, fixed on an iron frame and dried at 150° C. for one hour and then at 250° C. for one hour, whereby a film was obtained. As a result of measurement of the softening point of the thus-obtained polyimide film by the penetration method under a load of 2.5 MPa at a heating rate of 10° C./min, it proved to be 236° C. In addition, a flexibility test was conducted by bending the film over an angle of 180°. The film did not develop cracks, thus showing good flexibility.

EXAMPLE 2

Figure 2:
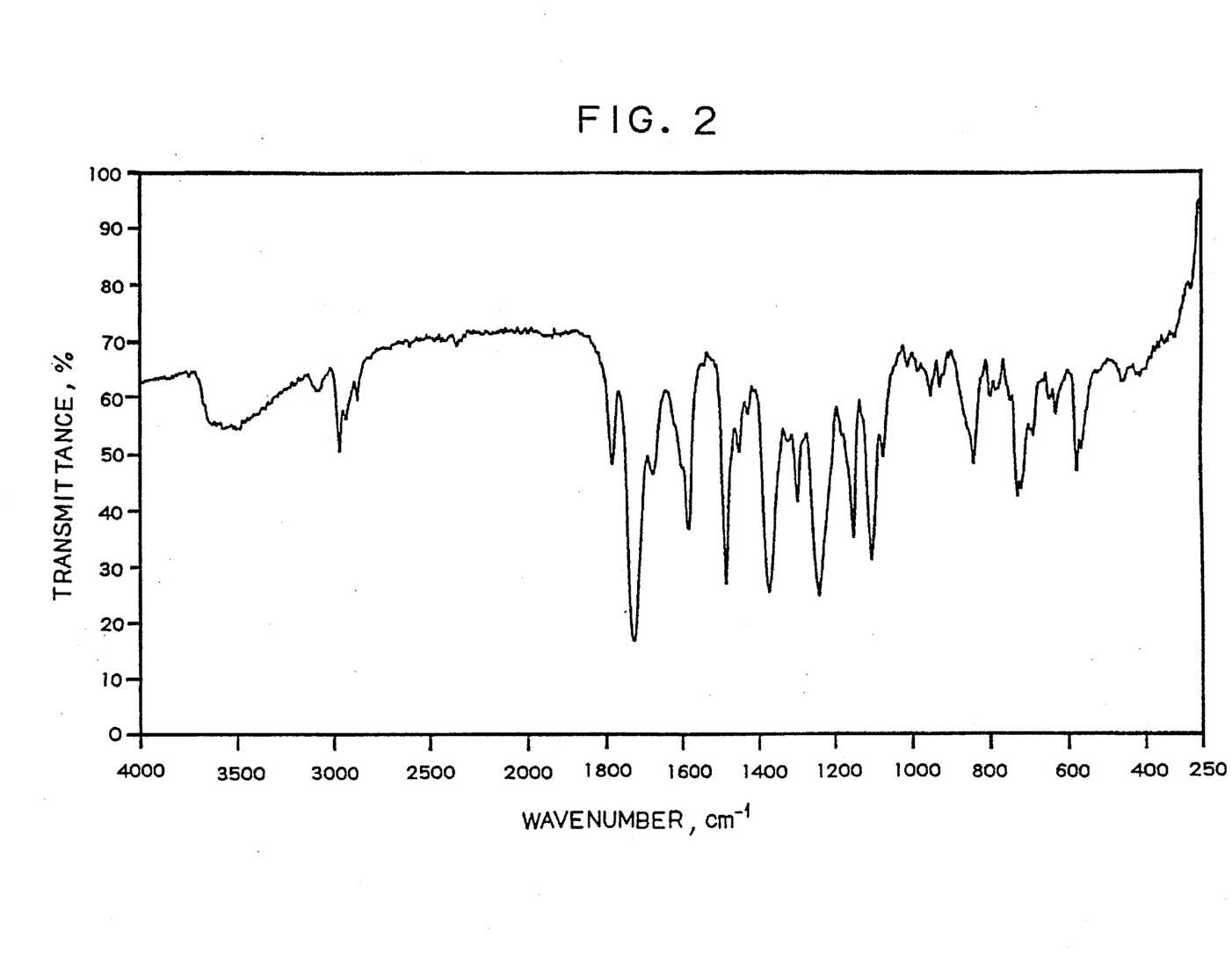
FIG. 2 is an infrared absorption spectrum of the polyimide obtained in Example 2.

In a similar manner to Example 1 except that the amounts of IPDDM and m-APPS used were changed to 0.13 g (3.5 mmole) and 0.28 g (6.5 mmole), respectively, a polyimide was obtained in the form of powder. Using the polyimide powder so obtained, measurement of its reduced viscosity and its solubility test were conducted as in Example 1. As a result, the polyimide powder had a reduced viscosity of 0.78 dl/g and was soluble in DMF, dioxane, methylene chloride and a 1:1 (weight ratio) mixed solvent of DMF and toluene. FIG. 2 shows an infrared absorption spectrum of the polyimide powder. In addition, its softening point was 241° C. as measured in accordance with the procedure of Example 1. As a result of a flexibility test, the film did not develop cracks, thus exhibiting good flexibility.

EXAMPLE 3

In a similar manner to Example 1 except that 3.11 g (8.5 mmole) of IPDDM and 0.62 g (1.5 mmole) of 2,2'-bis[(4-aminophenoxy)phenyl]propane were used instead of 0.55 g of IPDDM and 3.67 g of m-APPS, respectively, a polyimide was obtained in the form of powder. The polyimide powder so obtained had a reduced viscosity of 0.75 dl/g and was soluble in DMF and NMP. In addition, its softening point was 245° C.

Comparative Example 1

In a similar manner to Example 1 except that 4.32 g (10.0 mmole) of m-APPS were used instead of 0.55 g of IPDDM and 3.67 g of m-APPS, a polyimide powder was obtained in the form of powder. Following the procedure of Example 1, a solubility test was conducted using the polyimide powder so obtained. As a result, the powder was substantially insoluble in DMF and a 1:1 (weight ratio) mixed solvent of DMF and toluene.

Comparative Example 2

In a similar manner to Example 1 except that 3.66 g (10.0 mmole) of IPDDM were used instead of 0.55 g of IPDDM and 3.67 g of m-APPS, a polyimide was obtained in the form of powder. The reduced viscosity of the polyimide powder so obtained was measured as in Example 1. As a result, it was found to have a reduced viscosity of 0.48 dl/g and to be soluble in DMF, NMP, DMAc, dioxane, methylene chloride, tetrahydrofuran and a 1:1 (weight ratio) mixed solvent of DMF and toluene. In addition, its softening point as measured in a manner similar to Example 1 was at least 300° C. As a result of a flexibility test, the film developed cracks, thus exhibiting inferior flexibility.

Comparative Example 3

In a four-necked flask equipped with a stirrer, thermometer, nitrogen inlet tube and calcium chloride tube, 2.16 g (5.0 mmole) of m-APPS, 0.61 g (5.0 mmole) of meta-toluylenediamine and 24.0 g of DMF were charged and then stirred into a solution. To the resulting solution, 3.22 g (10.0 mmole) of BTDA were added in portions under ice cooling. The resulting mixture was thereafter reacted for 5 hours under cooling below 5° C., whereby a polyamic acid was synthesized in the form of a varnish. Acetic anhydride (2.55 g) and 1.98 g of pyridine were added to the resultant varnish of the polyamic acid, followed by reaction at room temperature for 3 hours to synthesize a polyimide in the form of a varnish. The varnish of the polyimide so obtained was poured into water. The resulting precipitate was collected, pulverized and dried, whereby the polyimide powder was obtained in the form of powder.

With respect to the polyimide powder so obtained, the measurement of its reduced viscosity and a solubility test were conducted in accordance with Example 1. As a result, the polyimide powder had a reduced viscosity of 0.72 dl/g. It was soluble in DMF, however, insoluble in a 1:1 (weight ratio) mixed solvent of DMF and toluene.

Comparative Example 4

In a similar manner to Example 1 except that 2.27 g (8.5 mmole) of 4,4'-methylenebis-(o-chloroaniline) were used instead of m-APPS, preparation of a polyimide in the form of powder was tried. A resin, however, began to precipitate in the course of a reaction subsequent to the addition of acetic anhydride and pyridine. The polyimide powder so obtained was insoluble in DMF.

Comparative Example 5

In a similar manner to Example 1 except that IPDDM and m-APPS were replaced by 0.38 g (1.5 mmole) of 4,4'-diamino-3,3',5,5'-tetramethyldiphenylmethane and 2.11 g (8.5 mmole) of 3,3'-sulfonyldianiline, respectively, preparation of a polyimide in the form of powder was tried. A resin, however, began to precipitate in the course of a reaction subsequent to the addition of acetic anhydride and pyridine. The polyimide powder so obtained was insoluble in DMF.

Comparative Example 6

In a similar manner to Example 2 except that 2.07 g (6.5 mmole) of 3,3'-dimethoxybenzidine were used instead of m-APPS, preparation of a polyimide in the form of powder was tried. A resin, however, began to precipitate in the course of a reaction subsequent to the addition of acetic anhydride and pyridine. The polyimide powder so obtained was insoluble in DMF.

Since the polyimide was insoluble, its precursor, i.e., the polyamic acid was used in the form of a vanish. From that varnish, a film was obtained in a similar manner to Example 1. The softening point of the film was at least 300° C.

EXAMPLE 4

The polyimide powder (100 g) obtained in Example 1 and 50 g of N,N'-(4,4'-diphenylmethane)bismaleimide (BMI) were dissolved in a mixed solvent consisting of 200 g of DMF and 200 g of toluene, followed by the addition of 3 g of dicumyl peroxide to obtain a resin composition in the form of a varnish. The resin composition so obtained was cast onto a glass plate and dried at 100° C. for 10 minutes. The resulting green film was then peeled off from the glass plate, fixed on an iron frame, and then heated at 150° C. for 30 minutes so that a well-dried, uncured, film-like adhesive was obtained. The film-like adhesive so obtained had a thickness of 25 μm and a softening point of 143° C. It did not develop cracks when bent over an angle of 180°, thus exhibiting excellent flexibility.

The film-like adhesive was heated and cured at 200° C. for one hour. The cured film so obtained had a glass transition point of 230° C. In addition, the cured film showed no change in external appearance when immersed in methylene chloride at room temperature for 30 minutes.

The film-like adhesive was sandwiched between two copper foils of 35 μm in thickness, each having a roughened surface on an inner side, and was pressed at 200° C. and 3 MPa for one hour, whereby a substrate for a flexible printed circuit board was obtained. The substrate proved to have a 90°-copper-foil peel strength of 1.4 kN/m at room temperature and 1.2 kN/m at 200° C. (in each case, when measured at a pulling rate of 50 mm/min). In addition, the substrate was immersed for 60 seconds in a solder bath controlled at 300° C. However, neither blisters nor peeling occurred.

EXAMPLE 5

In a similar manner to Example 4 except that 30 g of N,N'-[4,4'-[2,2'-bis[4-(4-phenoxy)phenyl)]isopropylidene]] bismaleimide (BBMI) were used instead of BMI, a film-like adhesive was obtained. The film-like adhesive so obtained had a thickness of 25 μm and a softening point of 150° C. It did not develop cracks when bent over an angle of 180°, thus exhibiting excellent flexibility.

The film-like adhesive was heated and cured at 200° C. for one hour. The cured film had a glass transition point of 220° C.

Using the film-like adhesive, a substrate for a flexible printed circuit board was formed as in Example 4. The substrate proved to have a 90°-copper-foil peel strength of 0.8 kN/m at room temperature and 0.7 kN/m at 200° C. (in each case, when measured at a pulling rate of 50 mm/min). In addition, the substrate was immersed for 60 seconds in a solder bath controlled at 300° C. However, neither blisters nor peeling occurred.

EXAMPLE 6

The polyimide powder (100 g) obtained in Example 2 and 30 g of BMI were dissolved in a mixed solvent consisting of 200 g of DMF and 200 g of toluene, followed by the addition of 3 g of dicumyl peroxide to obtain a resin composition in the form of a varnish. Using the resin composition so obtained, a film-like adhesive was formed as in Example 4. The film-like adhesive so obtained had a thickness of 25 μm and a softening point of 155° C. It did not develop cracks when bent over an angle of 180°, thus showing excellent flexibility.

The film-like adhesive was heated and cured at 230° C. for one hour. The cured film so obtained had a glass transition point of 230° C. In addition, the cured film showed no change in external appearance when immersed in methylene chloride at room temperature for 30 minutes.

EXAMPLE 7

In a similar manner to Example 4 except the amount of BMI used was changed from 50 g to 10 g, a film-like adhesive was formed. The film-like adhesive so obtained had a thickness of 25 μm and a softening point of 175° C. It did not develop cracks when bent over an angle of 180°, thus exhibiting excellent flexibility.

The film-like adhesive was heated and cured at 200° C. for one hour. The cured film so obtained had a glass transition point of 220° C. In addition, the cured film showed no change in external appearance when immersed in methylene chloride at room temperature for 30 minutes.

The film-like adhesive was sandwiched between two copper foils of 35 μm, each having a roughened surface on an inner side, and was pressed at 230° C. and 3 MPa for one hour, whereby a substrate for a flexible printed circuit board was obtained. The substrate proved to have a 90°-copper-foil peel strength of 0.7 kN/m at room temperature (when measured at a pulling rate of 50 mm/min). In addition, the substrate was immersed for 60 seconds in a solder bath controlled at 300° C. However, neither blisters nor peeling occurred.

EXAMPLE 8

In a similar manner to Example 2 except that IPDDM and m-APPS were replaced by 1.09 g (3.5 mmole) of 4,4'-diamino-3,3',5,5'-tetraethyldiphenylmethane and 1.90 g (6.5 mmole) of 3,3'-bis(3-aminophenoxy)benzene, respectively, the polyimide was obtained in the form of powder. The polyimide powder so obtained had a reduced viscosity of 0.63 dl/g and was soluble in DMF, NMP and dioxane. The powder had a softening point of 230° C.

Using 100 g of the polyimide powder and 30 g of BMI, a film-like adhesive was formed in a similar manner to Example 4. The film-like adhesive so obtained had a softening point of 145° C. and, after having been cured, had a glass transition point of 210° C. When it was immersed in methylene chloride at room temperature for 30 minutes, no change occurred in external appearance.

Comparative Example 7

The polyimide powder (100 g) obtained in Comparative Example 2 and 30 g of BMI were dissolved in a mixed solvent consisting of 200 g of DMF and 200 g of toluene, followed by the addition of 3 g of dicumyl peroxide to obtain a resin composition in the form of a varnish. Using the resin composition so obtained, a film-like adhesive was formed in accordance with Example 4. The film-like adhesive so obtained had a thickness of 25 μm and a softening point of 320° C.

The film-like adhesive was heated and cured at 230° C. for one hour, and then immersed in methylene chloride at room temperature for 30 minutes. As a result, the adhesive was substantially dissolved in methylene chloride. In addition, the film-like adhesive developed cracks when bent over an angle of 180°.

The film-like adhesive was sandwiched between two copper foils of 35 μm, each having a roughened surface on an inner side, and was pressed at 230° C. and 3 MPa for one hour. The copper foils, however, were not bonded, thereby failing to obtain a substrate for a flexible printed circuit board.

Comparative Example 8

The polyimide powder (100 g) obtained in Comparative Example 3 and 10 g of BMI were dissolved in 400 g of DMF, whereby a resin composition was obtained in the form of a varnish. The resin composition so obtained was cast onto a glass plate and dried at 100° C. for 10 minutes. The dried composition was peeled off from the plate to obtain a film. The film so obtained was fixed on an iron frame and heated at 150° C. for 30 minutes and then at 180° C. for 30 minutes, whereby a well-dried, uncured film-like adhesive was formed. The film-like adhesive so obtained had a softening point of 230° C. It did not develop cracks when bent over an angle of 180°, thus showing excellent flexibility.

The film-like adhesive was sandwiched between two copper foils of 35 μm, each having a roughened surface on an inner side, and was pressed at 200° C. and 3 MPa for one hour. The two copper foils, however, were not adhered. On the other hand, 3 g of dicumyl peroxide were dissolved in the resin composition and treated in a similar manner as described above, whereby a film-like adhesive was formed. The film-like adhesive so obtained was sandwiched between two copper foils of 35 μm, each having a roughened surface on an inner side, and was pressed at 3 MPa and 200° C. for one hour. It was however unable to have the two copper foils adhered with each other.

EXAMPLE 9

A four-necked flask fitted with a thermometer, stirrer, nitrogen inlet tube and cooling tube was charged with 88.1 g (0.204 mole) of bis[4-(3-aminophenoxy)phenyl]sulfone and 13.2 g of (0.036 mole) of 4,4'-methylenebis(2,6-diisopropylaniline). In a nitrogen atmosphere, 536 g of N,N-dimethylformamide were added to the mixture and then dissolved. To the resulting solution, 77 3 g (0 24 mole) of 3,3',4,4'-benzophenonetetracarboxylic dianhydride were added carefully to avoid any temperature increase beyond 30° C.

After stirring the reaction mixture at room temperature for 3 hours, 178 g of N,N-dimethylformamide were added to dilute the same. Acetic anhydride (61 g) and pyridine (47 g) were added to the diluted solution, followed by further stirring at 30° C. for 5 hours. The reaction mixture so obtained was poured in methanol to isolate a polymer. The isolated polymer was purified by refluxing it in acetone for 30 minutes, followed by drying under reduced pressure.

Dissolved in 90 g of N,N-dimethylformamide were 17.5 g of the powdery polymer so obtained, 5 g of a brominated bisphenol epoxy resin, 3.7 g of bismaleimidodiaminodiphenylmethane, 0.124 g of dicyanamide, 0.0125 g of 2-ethyl-4-methylimidazole and 0.75 g of dicumyl peroxide.

The varnish so obtained was cast onto a glass plate and dried at 100° C. for 10 minutes. The resulting green film was peeled off from the glass plate, fixed on an iron frame, and then dried at 150° C. for 20 minutes, whereby a sheet of 25 μm thick was obtained. The procedures were repeated to obtain another polyimide film having an adhesive layer on one side and a copper foil on the other side. They were superposed one over the other, and copper foils of 35 μm thick were placed on the opposite outer sides of the superposed sheets, respectively. Pressure was then applied on them at 3 MPa and 180° C. for 60 minutes, whereby a flexible laminate coated with copper on both 10 sides was obtained.

EXAMPLE 10

The varnish obtained in Example 9 was coated onto a film side of a polyimide film clad on the other side with a copper foil. The varnish was heated at 100° C. for 10 minutes, and then at 150° C. for 20 minutes, whereby an adhesive layer of 10 μm thick was formed. The procedures were repeated to obtain another polyimide film having an adhesive layer on one side and a copper foil on the other side. The polyimide films so obtained were brought into a contiguous relationship with their adhesive layers inside, heated at 180° C. under a pressure of 3 MPa for 60 minutes, whereby a flexible laminate laminated with the copper foils on both sides was formed.

EXAMPLE 11

The varnish obtained in Example 9 was coated on to one side of a polyimide film of 75 μm thick, followed by heating at 100° C. for 10 minutes and then at 150° C. for 20 minutes, whereby an adhesive layer of 20 μm thick was formed.

The so-obtained polyimide film having the adhesive layer on the one side was clad with a copper foil of 35 μm at a temperature of 180° C., a cylinder pressure of 0.5 MPa and a rolling rate of 1 m/min by a roll laminator. The film so clad was cured for 60 minutes in a drier of 180° C. so that a polyimide film clad on one side thereof with the copper foil was obtained.

With respect to the flexible laminates obtained in Examples 9 and 10 and the polyimide film clad on one side thereof with the copper foil obtained in Example 11, peel strength and solder resistance were tested in terms of their external appearance after having been caused to float for one minute on the molten solder in a 288° C. solder bath. The results are summarized in Table 1.

TABLE 1

| | Example 9 | Example 10 | Example 11 |
|---|---|---|---|
| Peel strength (kN/m) Room temp. | 1.7 | 1.4 | 1.6 |
| 150° C. | 1.4 | 1.2 | 1.3 |
| Solder resistance | Good | Good | Good |

Comparative Example 9

In a similar manner to Example 9 except that an acrylic sheet-like adhesive was used instead, a flexible laminate clad on both sides with copper foils was obtained. The peel strength of the laminate at room temperature was 2.2 kN/m, which dropped to 0.5 kN/m at 150° C. When caused to float for one minute on the molten solder in a 288° C. solder bath, blisters were formed therein.

Comparative Example 10

In a similar manner to Example 1 except that a sheet-like polyimide adhesive was used instead, a flexible laminate coated on both sides with copper foils was obtained. The peel strength of the laminate at room temperature was so weak that it could not be measured.

We claim:

1. A thermosetting resin composition comprising:

(A) a polyimide comprising structural units represented by the following formula (I):

wherein Ar is a group consisting of:
i) 10–90 mole % of a structural sub-unit represented by the following formula (a):

wherein $Z^4$ represents —$SO_2$— or —$C(CH_3)_2$—
ii) 90–10 mole % of another structural sub-unit represented by the following formula (b):

wherein $R^1$, $R^2$, $R^3$, and $R^4$ independently represent a hydrogen atom or a $C_{1-4}$alkyl or alkoxyl group, at least two of which are independently an alkyl or alkoxyl group and X is —$CH_2$—, —$C(CH_3)_2$—, —O—, —$SO_2$—, —C(=O)—, or —CO—NH—;

(B) a polymaleimide represented by the following formula (II):

wherein l stands for an integer of 2 or greater and R is a group having 2 or more carbon atoms and a valence of l; and (C) an epoxy resin.

2. An adhesive sheet comprising a thermosetting resin composition according to claim 1, said composition being in the form of a sheet.

* * * * *